United States Patent
Lee et al.

(10) Patent No.: US 10,090,458 B2
(45) Date of Patent: Oct. 2, 2018

(54) MAGNETIC MEMORY DEVICE

(71) Applicants: Sung Chul Lee, Osan-si (KR); Ki Woong Kim, Hwaseong-si (KR); Sang Hwan Park, Hwaseong-si (KR); Sechung Oh, Yongin-si (KR)

(72) Inventors: Sung Chul Lee, Osan-si (KR); Ki Woong Kim, Hwaseong-si (KR); Sang Hwan Park, Hwaseong-si (KR); Sechung Oh, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/617,012

(22) Filed: Jun. 8, 2017

(65) Prior Publication Data

US 2018/0123025 A1 May 3, 2018

(30) Foreign Application Priority Data

Oct. 31, 2016 (KR) .................. 10-2016-0143509

(51) Int. Cl.

| | |
|---|---|
| *H01L 27/00* | (2006.01) |
| *H01L 43/08* | (2006.01) |
| *H01L 43/10* | (2006.01) |
| *H01L 43/12* | (2006.01) |
| *H01F 10/32* | (2006.01) |
| *H01F 10/12* | (2006.01) |

(52) U.S. Cl.
CPC ............ *H01L 43/08* (2013.01); *H01F 10/12* (2013.01); *H01F 10/3204* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,608,738 B2 | 8/2003 | Sakakima et al. | |
| 8,277,961 B2 | 10/2012 | Watanabe | |
| 9,130,155 B2 | 9/2015 | Chepulskyy et al. | |
| 9,184,376 B2 | 11/2015 | Park et al. | |
| 2011/0045318 A1* | 2/2011 | Lee .................. | G11B 5/72 |
| | | | 428/832 |
| 2015/0035095 A1 | 2/2015 | Kim et al. | |
| 2015/0129996 A1 | 5/2015 | Tang et al. | |

(Continued)

*Primary Examiner* — Reema Patel
(74) *Attorney, Agent, or Firm* — Myers Bigel, P.A.

(57) ABSTRACT

A magnetic memory device includes a reference magnetic structure, a free magnetic structure, and a tunnel barrier pattern between the reference magnetic structure and the free magnetic structure. The reference magnetic structure includes a first pinned pattern, a second pinned pattern between the first pinned pattern and the tunnel barrier pattern, and an exchange coupling pattern between the first and the second pinned pattern. The second pinned pattern includes a first magnetic pattern adjacent the exchange coupling pattern, a second magnetic pattern adjacent the tunnel barrier pattern, a third magnetic pattern between the first and the second magnetic pattern, a first non-magnetic pattern between the first and the third magnetic pattern, and a second non-magnetic pattern between the second and the third magnetic pattern. The first non-magnetic pattern has a different crystal structure from the second non-magnetic pattern, and at least a portion of the third magnetic pattern is amorphous.

20 Claims, 11 Drawing Sheets

(56) References Cited

U.S. PATENT DOCUMENTS

| | | | |
|---|---|---|---|
| 2015/0162525 A1* | 6/2015 | Park | H01L 43/10 257/421 |
| 2015/0228321 A1 | 8/2015 | Lee et al. | |
| 2015/0340600 A1 | 11/2015 | Kim et al. | |
| 2016/0079520 A1 | 3/2016 | Park et al. | |

* cited by examiner

MAGNETIC MEMORY DEVICE

REFERENCE TO PRIORITY APPLICATION

This U.S. non-provisional patent application claims priority under 35 U.S.C. § 119 to Korean Patent Application No. 10-2016-0143509, filed on Oct. 31, 2016, the disclosure of which is incorporated herein in its entirety by reference.

BACKGROUND

Embodiments of the inventive concepts relate to semiconductor memory devices, and more particularly, to a magnetic memory devices.

Due to increasing demand for electronic devices with a high speed and/or low power consumption, semiconductor devices may require faster operating speeds and/or lower operating voltages. Magnetic memory devices have been suggested to satisfy such requirements. For example, magnetic memory devices can provide technical advantages, such as reduced latency and/or non-volatility. As a result, magnetic memory devices may be used in next-generation memory devices.

Generally, a magnetic memory device may include a magnetic tunnel junction pattern (MTJ). A magnetic tunnel junction pattern may include two magnetic layers and an insulating layer interposed the two magnetic layers. A resistance value of the magnetic tunnel junction pattern may vary depending on magnetization directions of the two magnetic layers. For example, the resistance value of the magnetic tunnel junction pattern may be higher when magnetization directions of the two magnetic layers are anti-parallel to each other than when they are parallel to each other. Data can be stored into and/or read out from the magnetic tunnel junction pattern by using a difference between these resistance values.

SUMMARY

According to some embodiments of the inventive concepts, a magnetic memory device may include a reference magnetic structure and a free magnetic structure on a substrate, and a tunnel barrier pattern between the reference magnetic structure and the free magnetic structure. The reference magnetic structure includes a first pinned pattern, a second pinned pattern between the first pinned pattern and the tunnel barrier pattern, and an exchange coupling pattern between the first pinned pattern and the second pinned pattern. The second pinned pattern includes a first magnetic pattern adjacent the exchange coupling pattern, a second magnetic pattern adjacent the tunnel barrier pattern, a third magnetic pattern between the first magnetic pattern and the second magnetic pattern, a first non-magnetic pattern between the first magnetic pattern and the third magnetic pattern, and a second non-magnetic pattern between the second magnetic pattern and the third magnetic pattern. The first non-magnetic pattern has a different crystal structure from the second non-magnetic pattern, and at least a portion of the third magnetic pattern is amorphous.

According to some embodiments of the inventive concepts, a magnetic memory device may include a reference magnetic structure and a free magnetic structure on a substrate, and a tunnel barrier pattern between the reference magnetic structure and the free magnetic structure. The reference magnetic structure includes a first pinned pattern, a second pinned pattern between the first pinned pattern and the tunnel barrier pattern, and an exchange coupling pattern between the first pinned pattern and the second pinned pattern. The second pinned pattern includes a first magnetic pattern adjacent the exchange coupling pattern, a second magnetic pattern adjacent the tunnel barrier pattern, a third magnetic pattern between the first magnetic pattern and the second magnetic pattern, a first non-magnetic pattern between the first magnetic pattern and the third magnetic pattern, and a second non-magnetic pattern between the second magnetic pattern and the third magnetic pattern. The first non-magnetic pattern includes a different material from the second non-magnetic pattern, and at least a portion of the third magnetic pattern is amorphous.

According to some embodiments of the inventive concepts, a magnetic memory device may include a magnetic tunnel junction (MTJ) pattern that may include a reference magnetic structure, a free magnetic structure, and a tunnel barrier pattern therebetween. The reference magnetic structure may include first and second pinned patterns and an exchange coupling pattern therebetween. The second pinned pattern may include a first magnetic pattern, a first non-magnetic pattern, a second non-magnetic pattern, and a second magnetic pattern that are sequentially stacked between the exchange coupling pattern and the tunnel barrier pattern. The first non-magnetic pattern and the first magnetic pattern may include a same crystal structure. The second non-magnetic pattern may include a different crystal structure than the first non-magnetic pattern. The second pinned pattern may further include a third magnetic pattern, which may be at least partially amorphous, between the first and second non-magnetic patterns.

BRIEF DESCRIPTION OF THE DRAWINGS

Embodiments will be more clearly understood from the following brief description taken in conjunction with the accompanying drawings. The accompanying drawings represent non-limiting embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the inventive concepts will now be described more fully with reference to the accompanying drawings, in which embodiments are shown. Embodiments of the inventive concepts may, however, be embodied in many different forms and should not be construed as being limited to the embodiments set forth herein; rather, these embodiments are provided so that this disclosure will be thorough and complete, and will fully convey the concepts of embodiments to those of ordinary skill in the art.

Figure 1:
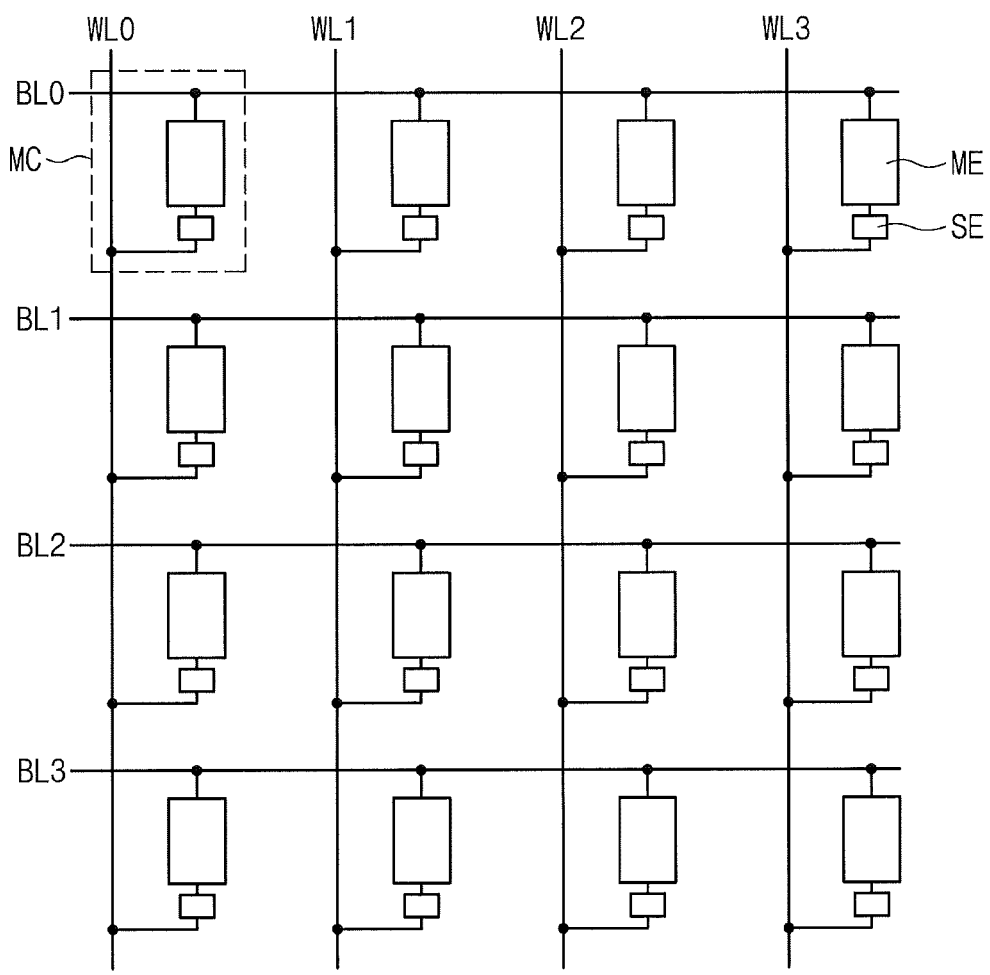
FIG. 1 is a circuit diagram illustrating a memory cell array of a magnetic memory device according to embodiments of the inventive concepts.
Figure 2:
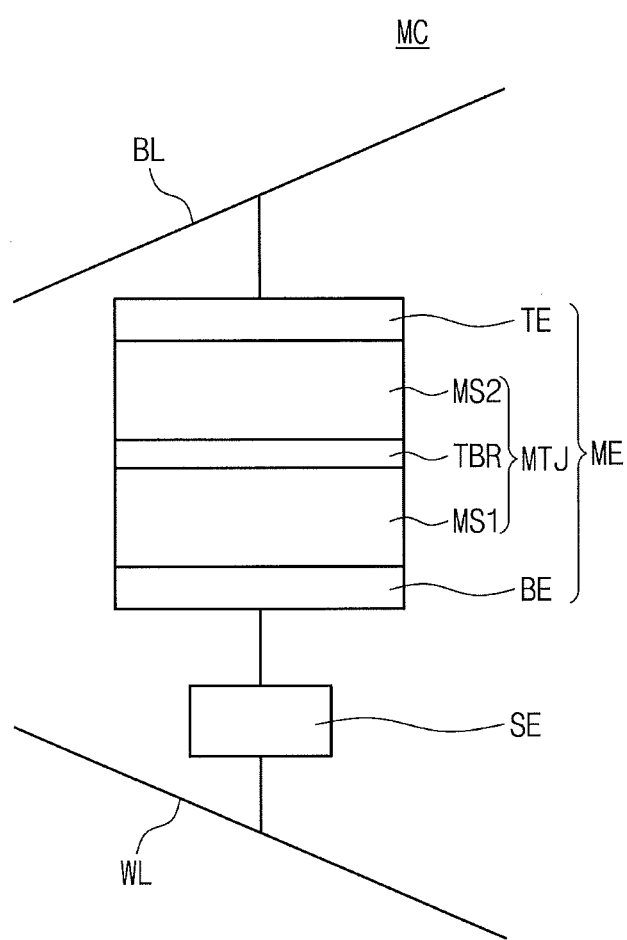
FIG. 2 is a circuit diagram illustrating a unit memory cell of a magnetic memory device according to embodiments of the inventive concepts.

FIG. 1 is a circuit diagram illustrating a memory cell array of a magnetic memory device according to embodiments of the inventive concepts. FIG. 2 is a circuit diagram illustrating a unit memory cell of a magnetic memory device according to embodiments of the inventive concepts.

Referring to FIG. 1, the memory cell array 10 may include a plurality of word lines WL0-WL3, a plurality of bit lines BL0-BL3 and unit memory cells MC. The unit memory cells MC may be two or three dimensionally arranged. The word lines WL0-WL3 and the bit lines BL0-BL3 may be provided to cross each other, and each of the unit memory cells MC may be provided at a corresponding one of intersections between the word lines WL0-WL3 and bit lines BL0-BL3. Each of the word lines WL0-WL3 may be connected to a plurality of the unit memory cells MC. The unit memory cells MC connected to each of the word lines WL0-WL3 may be connected to the bit lines BL0-BL3, respectively. The unit memory cells MC connected to each of the bit lines BL0-BL3 may be connected to the word lines WL0-WL3, respectively. Accordingly, the unit memory cells MC connected to the word line WL may be connected to a read and write circuit through the bit lines BL0-BL3, respectively.

Referring to FIG. 2, the unit memory cell MC may include a memory element ME and a select element SE. The memory element ME may be provided between the bit line BL and the select element SE. The select element SE may be provided between the memory element ME and the word line WL. The memory element ME may be a variable resistance device whose resistance can be switched to one of at least two states by an electric pulse applied thereto.

The memory element ME may be formed to have a layered structure, whose electric resistance can be changed by a spin transfer process using an electric current passing therethrough. For example, the memory element ME may have a layered structure configured to exhibit a magnetoresistance property, and may include at least one ferromagnetic material and/or at least one antiferromagnetic material.

The select element SE may be configured to selectively control a flow of electric charges passing through the memory element MC. For example, the select element SE may be one of a diode, a p-n-p bipolar transistor, an n-p-n bipolar transistor, an n-channel metal-oxide-semiconductor field effect transistor (NMOSFET) and a p-channel metal-oxide-semiconductor field effect transistor (PMOSFET). When the select element SE is a three-terminal switching device, such as a bipolar transistor or a MOSFET, an additional interconnection line may be connected to the select element SE.

The memory element ME may include a first magnetic structure MS1, a second magnetic structure MS2 and a tunnel barrier TBR interposed therebetween. The first magnetic structure MS1, the second magnetic structure MS2 and the tunnel barrier TBR may constitute or define a magnetic tunnel junction MTJ. The first and second magnetic structures MS1 and MS2 may respectively include at least one magnetic layer formed of a magnetic material. The memory element ME may further include a bottom electrode BE and a top electrode TE. The bottom electrode BE may be interposed between the first magnetic structure MS1 and the select element SE, and the top electrode TE may be interposed between the second magnetic structure MS2 and the bit line BL.

Figure 3:
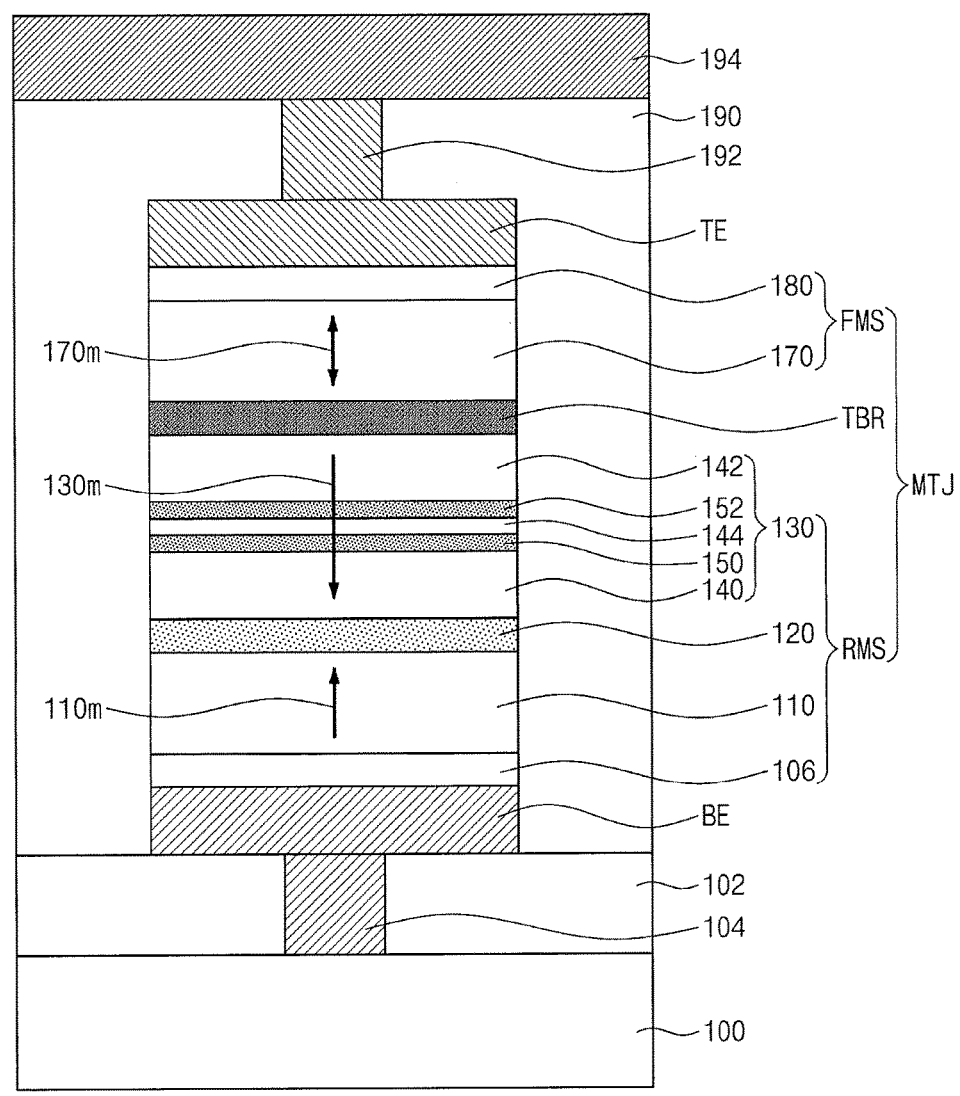
FIG. 3 is a cross-sectional view illustrating a magnetic memory device according to some embodiments of the inventive concepts.
Figure 4:
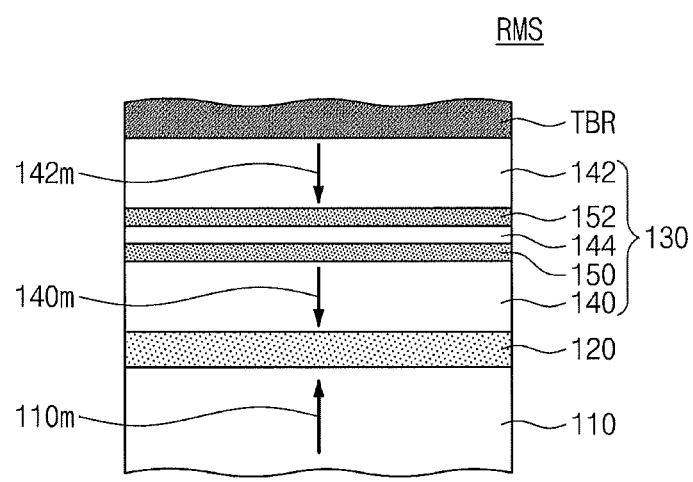
FIG. 4 is an enlarged view illustrating a reference magnetic structure (RMS) of FIG. 3 according to some embodiments.
Figure 5A:
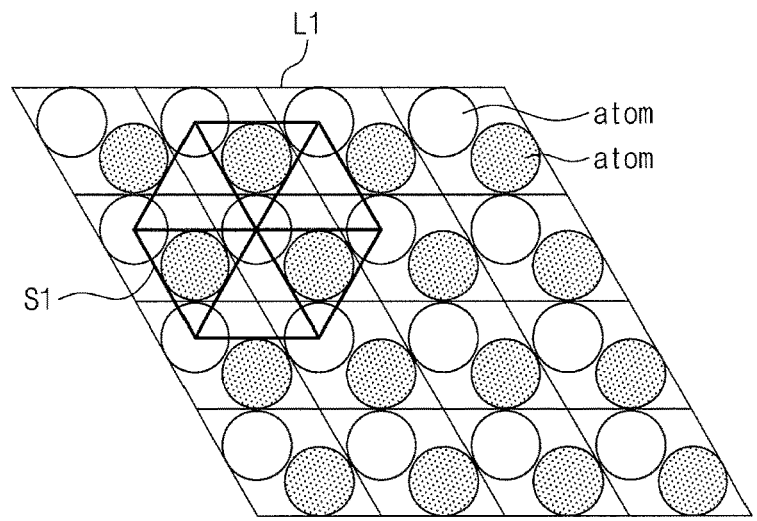
FIG. 5A is a diagram illustrating an arrangement of atoms in a first magnetic pattern and a first non-magnetic pattern of FIG. 3 when viewed in a plan view according to some embodiments.
Figure 5B:
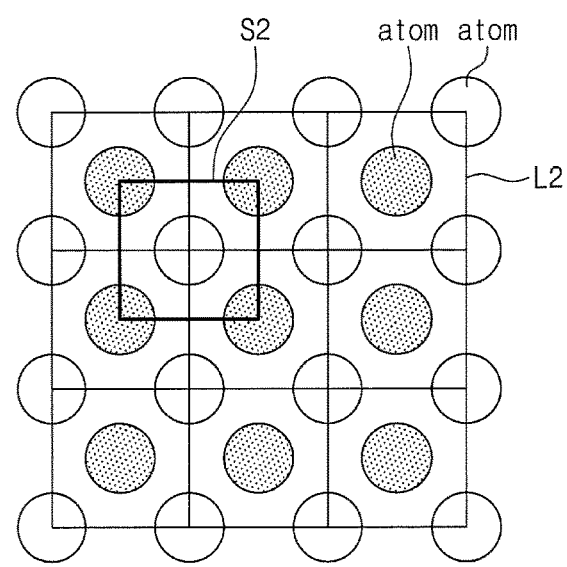
FIG. 5B is a diagram illustrating an arrangement of atoms in a second magnetic pattern and a second non-magnetic pattern of FIG. 3 when viewed in a plan view according to some embodiments.

FIG. 3 is a cross-sectional view illustrating a magnetic memory device according to some embodiments of the inventive concepts. FIG. 4 is an enlarged view illustrating a reference magnetic structure of FIG. 3. FIG. 5A is a diagram illustrating an arrangement of atoms in a first magnetic pattern and a first non-magnetic pattern of FIG. 3 when viewed in a plan view. FIG. 5B is a diagram illustrating an arrangement of atoms in a second magnetic pattern and a second non-magnetic pattern of FIG. 3 when viewed in a plan view.

Referring to FIG. 3, a lower interlayer insulating layer 102 may be provided on a substrate 100. The substrate 100 may be a semiconductor substrate including silicon (Si), silicon-on-insulator (SOI), silicon germanium (SiGe), germanium (Ge), or gallium arsenide (GaAs). Selection elements such, for example, field effect transistors or diodes may be provided on the substrate 100, and the lower interlayer insulating layer 102 may be provided to extend on or cover the selection elements. The lower interlayer insulating layer 102 may include oxide, nitride and/or oxynitride.

A lower contact plug 104 may be provided in the lower interlayer insulating layer 102. The lower contact plug 104 may penetrate the lower interlayer insulating layer 102 and may be electrically coupled to a terminal of a corresponding one of the selection elements. The lower contact plug 104 may include at least one of doped semiconductor materials (e.g., doped silicon), metals (e.g., tungsten, titanium and/or tantalum), conductive metal nitrides (e.g., titanium nitride, tantalum nitride and/or tungsten nitride) or metal-semiconductor compounds (e.g., metal silicide).

A bottom electrode BE may be provided on the lower interlayer insulating layer 102. The bottom electrode BE may be electrically coupled to the lower contact plug 104. The bottom electrode BE may include a conductive material. As an example, the bottom electrode BE may include conductive metal nitrides, such as titanium nitride and/or tantalum nitride.

A reference magnetic structure RMS and a free magnetic structure FMS may be stacked on the lower interlayer insulating layer 102. A tunnel barrier pattern TBR may be provided between the reference magnetic structure RMS and the free magnetic structure FMS. In some embodiments, the reference magnetic structure RMS may be provided between the bottom electrode BE and the tunnel barrier pattern TBR.

The reference magnetic structure RMS may include at least one fixed layer having a fixed magnetization direction, and the free magnetic structure FMS may include at least one free layer having a switchable magnetization direction. The reference magnetic structure RMS, the free magnetic structure FMS and the tunnel barrier pattern TBR may constitute or define a magnetic tunnel junction pattern MTJ. The magnetization directions of the fixed layer and the free layer may be substantially perpendicular to an interface between the tunnel barrier pattern TBR and the free magnetic structure FMS. That is, the magnetic tunnel junction pattern MTJ may be a perpendicular magnetization-type magnetic tunnel junction pattern.

A top electrode TE may be provided on the magnetic tunnel junction pattern MTJ. The magnetic tunnel junction pattern MTJ may be interposed between the bottom electrode BE and the top electrode TE. In some embodiments, the free magnetic structure FMS may be provided between the tunnel barrier pattern TBR and the top electrode TE. The bottom electrode BE, the magnetic tunnel junction pattern MTJ and the top electrode TE may be provided to have vertically-aligned sidewalls. The top electrode TE may include a conductive material. As an example, the top electrode TE may include at least one of tantalum (Ta), aluminum (Al), copper (Cu), gold (Au), silver (Ag), or titanium (Ti).

The reference magnetic structure RMS may include a synthetic antiferromagnetic (SAF) structure. As an example, the reference magnetic structure RMS may include a first pinned pattern 110, a second pinned pattern 130 and an exchange coupling pattern 120 interposed between the first pinned pattern 110 and the second pinned pattern 130. The second pinned pattern 130 may be provided between the first pinned pattern 110 and the tunnel barrier pattern TBR. The exchange coupling pattern 120 may couple the first pinned pattern 110 to the second pinned pattern 130 in such a way that a magnetization direction 110$m$ of the first pinned pattern 110 is anti-parallel to a magnetization direction 130$m$ of the second pinned pattern 130. Thus, magnetic fields generated by the first and second pinned patterns 110 and 130 may offset each other to reduce or minimize a net magnetic field of the reference magnetic structure RMS. As a result, an influence of the magnetic field of the reference magnetic structure RMS on the free magnetic structure FMS can be reduced or minimized. For example, the exchange coupling pattern 120 may include ruthenium (Ru).

The first pinned pattern 110 may include perpendicular magnetic materials (e.g., CoFeTb, CoFeGd, CoFeDy), perpendicular magnetic materials with L10 structure, CoPt-based materials with hexagonal-close-packed lattices and/or perpendicular magnetic structures. The L10 perpendicular magnetic material may include at least one of L10 FePt, L10 FePd, L10 CoPd, or L10 CoPt. The perpendicular magnetic structure may include magnetic layers and non-magnetic layers that are alternatively and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers.

Referring to FIGS. 3 and 4, the second pinned pattern 130 may include a first magnetic pattern 140, a second magnetic pattern 142, a third magnetic pattern 144, a first non-magnetic pattern 150 and a second non-magnetic pattern 152. The first magnetic pattern 140 may be adjacent the exchange coupling pattern 120. The second magnetic pattern 142 may be adjacent the tunnel barrier pattern TBR. The third magnetic pattern 144 may be provided between the first magnetic pattern 140 and the second magnetic pattern 142. The first non-magnetic pattern 150 may be provided between the first magnetic pattern 140 and the third magnetic pattern 144. The second non-magnetic pattern 152 may be provided between the second magnetic pattern 142 and the third magnetic pattern 144.

The first magnetic pattern 140 may be in contact with the exchange coupling pattern 120. The first magnetic pattern 140 may be anti-ferromagnetically coupled to the first pinned pattern 110 through the exchange coupling pattern 120. The exchange coupling pattern 120 may couple the first pinned pattern 110 to the first magnetic pattern 140 in such a way that the magnetization direction 110$m$ of the first pinned pattern 110 is anti-parallel to a magnetization direction 140$m$ of the first magnetic pattern 140. That is, the magnetization direction 140$m$ of the first magnetic pattern 140 may be anti-parallel to the magnetization direction 110$m$ of the first pinned pattern 110.

The first magnetic pattern 140 may have a hexagonal close-packed (HCP) crystal structure or a face centered cubic (FCC) crystal structure. When the first magnetic pattern 140 has the hexagonal close-packed (HCP) crystal structure, the first magnetic pattern 140 may be provided to have a (0001) plane parallel to the interface between the tunnel barrier pattern TBR and the free magnetic structure FMS. When the first magnetic pattern 140 has the face centered cubic (FCC) crystal structure, the first magnetic pattern 140 may be provided to have a (111) plane parallel to the interface between the tunnel barrier pattern TBR and the free magnetic structure FMS. In some embodiments, the interface between the tunnel barrier pattern TBR and the free magnetic structure FMS may be substantially parallel to a top surface of the substrate 100. Thus, a (0001) plane of the first magnetic pattern 140 having a hexagonal close-packed (HCP) crystal structure, or a (111) plane of the first magnetic pattern 140 having a face centered cubic (FCC) crystal structure may be substantially parallel to the top surface of the substrate 100.

Referring to FIG. 5A, when viewed in a plan view (e.g., when viewed in a plan view parallel to the top surface of the substrate 100), atoms in the first magnetic pattern 140 may be arranged to have a 6-fold symmetry. A line L1 shown in FIG. 5A is a virtual line representing a crystal plane lattice, a line S1 is a virtual line representing an atomic arrangement of the 6-fold symmetry. The first magnetic pattern 140 may include a magnetic material that enhances antiferromagnetic coupling with the first pinned pattern 110. For example, the first magnetic pattern 140 may include at least one of cobalt (Co) or nickel (Ni).

The first non-magnetic pattern 150 may have a hexagonal close-packed (HCP) crystal structure or a face centered cubic (FCC) crystal structure. When the first non-magnetic pattern 150 has the hexagonal close-packed (HCP) crystal structure, the first non-magnetic pattern 150 may be provided to have a (0001) plane parallel to the interface between the tunnel barrier pattern TBR and the free magnetic structure FMS. When the first non-magnetic pattern 150 has the face centered cubic (FCC) crystal structure, the first non-magnetic pattern 150 may be provided to have a (111) plane parallel to the interface between the tunnel barrier pattern TBR and the free magnetic structure FMS. In some embodiments, the interface between the tunnel barrier pattern TBR and the free magnetic structure FMS may be substantially parallel to the top surface of the substrate 100. Thus, a (0001) plane of the first non-magnetic pattern 150 having a hexagonal close-packed (HCP) crystal structure, or a (111) plane of the first non-magnetic pattern 150 having a face centered cubic (FCC) crystal structure may be substantially parallel to the top surface of the substrate 100. As described with reference to FIG. 5A, when viewed in a plan view (e.g., when viewed in a plan view parallel to the top surface of the substrate 100), atoms in the first non-magnetic pattern 150 may be arranged to have 6-fold symmetry. That is, when viewed in a plan view, the arrangement of atoms in the first non-magnetic pattern 150 may have the same symmetry as the arrangement of atoms in the first magnetic pattern 140. The first non-magnetic pattern 150 may include at least one of Ir, Rh, Pd, Ag, Ru, Y, Sc, Zr, Hf, Ti or Re.

The second magnetic pattern 142 may be in contact with the tunnel barrier pattern TBR. Such a contact between the second magnetic pattern 142 and the tunnel barrier pattern TBR may induce magnetic anisotropy, allowing the second magnetic pattern 142 to have a perpendicular magnetization property. The second magnetic pattern 142 may be ferromagnetically coupled to the first magnetic pattern 140. That is, a magnetization direction 142m of the second magnetic pattern 142 may be parallel to the magnetization direction 140m of the first magnetic pattern 140. The magnetization directions 130m of the second pinned pattern 130 may be determined by the magnetization directions 140m and 142m of the first and second magnetic patterns 140 and 142. A crystal structure of the second magnetic pattern 142 may be different from crystal structures of the first magnetic pattern 140 and the first non-magnetic pattern 150. The second magnetic pattern 142 may have a body centered cubic (BCC) crystal structure. A (001) plane of the second magnetic pattern 142 having the body centered cubic (BCC) crystal structure may be provided to be parallel to the interface between the tunnel barrier pattern TBR and the free magnetic structure FMS. In some embodiments, the interface between the tunnel barrier pattern TBR and the free magnetic structure FMS may be substantially parallel to the top surface of the substrate 100. Thus, a (001) plane of the second magnetic pattern 142 having a body centered cubic (BCC) crystal structure may be substantially parallel to the top surface of the substrate 100.

Referring to FIG. 5B, when viewed in a plan view (e.g., when viewed in a plan view parallel to the top surface of the substrate 100), atoms in the second magnetic pattern 142 may be arranged to have a 4-fold symmetry. A line L2 shown in FIG. 5B is a virtual line representing a crystal plane lattice, a line S2 is a virtual line representing an atomic arrangement of the 4-fold symmetry. For example, the second magnetic pattern 142 may include iron (Fe). The second magnetic pattern 142 may include a magnetic material that induces magnetic anisotropy at an interface between the second magnetic pattern 142 and the tunnel barrier pattern TBR. For example, the second magnetic pattern 142 may include cobalt-iron-boron (CoFeB).

The second non-magnetic pattern 152 may have the same crystal structure as the second magnetic pattern 142. The second non-magnetic pattern 152 may have a body centered cubic (BCC) crystal structure. A (001) plane of the second non-magnetic pattern 152 having the body centered cubic (BCC) crystal structure may be provided to be parallel to the interface between the tunnel barrier pattern TBR and the free magnetic structure FMS. In some embodiments, the interface between the tunnel barrier pattern TBR and the free magnetic structure FMS may be substantially parallel to the top surface of the substrate 100. Thus, a (001) plane of the second non-magnetic pattern 152 having a body centered cubic (BCC) crystal structure may be substantially parallel to the top surface of the substrate 100. As described with reference to FIG. 5B, when viewed in a plan view (e.g., when viewed in a plan view parallel to the top surface of the substrate 100), atoms in the second non-magnetic pattern 152 may be arranged to have the 4-fold symmetry. That is, an arrangement of atoms in the second non-magnetic pattern 152 may have the same symmetry as an arrangement of atoms in the second magnetic pattern 142. The second non-magnetic pattern 152 may include at least one of W, Mo, Nb, Ta or V.

One surface of the third magnetic pattern 144 may be in contact with the first non-magnetic pattern 150, and the other surface of the third magnetic pattern 144 may be in contact with the second non-magnetic pattern 152. The one surface and the other surface of the third magnetic pattern 144 may be opposite to each other. The third magnetic pattern 144 may include, for example, boron (B). Since the third magnetic pattern 144 is interposed between the first non-magnetic pattern 150 and the second non-magnetic pattern 152, boron (B) in the third magnetic pattern 144 may be prevented (or suppressed) from being diffused into magnetic patterns (e.g., the first and second magnetic patterns 140 and 142) adjacent thereto during a thermal treatment process. In some embodiments, at least a portion of the third magnetic pattern 144 may be amorphous. The third magnetic pattern 144 may include, for example, iron-boron (FeB).

In some embodiments, a crystal structure of lower patterns (e.g., the first non-magnetic pattern 150 and the first magnetic pattern 140) under the third magnetic pattern 144 may be different from a crystal structure of upper patterns (i.e., the second non-magnetic pattern 152 and the second magnetic pattern 142) over the third magnetic pattern 144. The third magnetic pattern 144 may be provided between the first non-magnetic pattern 150 and the second non-magnetic pattern 152 having different crystal structures from each other.

The first non-magnetic pattern 150 may have a hexagonal close-packed (HCP) crystal structure or a face centered cubic (FCC) crystal structure, and when viewed in a plan view, an arrangement of atoms in the first non-magnetic pattern 150 may be provided to have the same symmetry as an arrangement of atoms in the first magnetic pattern 140. In this case, at an interface between the first non-magnetic pattern 150 and the first magnetic pattern 140, a magnetic moment of atoms in the first non-magnetic pattern 150 may be higher than when the first non-magnetic pattern 150 has a body centered cubic (BCC) crystal structure. Thus, a ferromagnetic coupling between the first magnetic pattern 140 and the second magnetic pattern 142 may be enhanced. Therefore, stability of magnetization of the reference magnetic structure RMS may be increased.

The second non-magnetic pattern 152 may have the same crystal structure as the second magnetic pattern 142. When viewed in a plan view, an arrangement of atoms in the second non-magnetic pattern 152 may be provided to have the same symmetry as an arrangement of atoms in the second magnetic pattern 142. In this case, the magnetic anisotropy of the second magnetic pattern 142 induced by a contact between the second magnetic pattern 142 and the tunnel barrier pattern TBR may be improved. Thus, tunneling magnetoresistance ratio (TMR) of the magnetic tunnel junction pattern MTJ may be improved.

In the case where at least a portion of the third magnetic pattern 144 is amorphous, it is possible to suppress that a crystal structure of the lower patterns (e.g., the first non-magnetic pattern 150 and the first magnetic pattern 140) under the third magnetic pattern 144 affects a crystal growth of the upper patterns (i.e., the second non-magnetic pattern 152 and the second magnetic pattern 142) over the third magnetic pattern 144. Accordingly, the magnetic anisotropy of the second magnetic pattern 142 may be improved, and as a result, the tunneling magnetoresistance ratio (TMR) of the magnetic tunnel junction pattern MTJ may be improved. In the case where a thickness of the third magnetic pattern 144 is increased, it is possible to further reduce or minimize that the crystal structure of the lower patterns affects the crystal growth of the upper patterns. However, a ferromagnetic coupling between the first magnetic pattern 140 and the second magnetic pattern 142 may be weakened. According to embodiments of the inventive concepts, even though the thickness of the third magnetic pattern 144 is increased, the first non-magnetic pattern 150 may suppress weakening of the ferromagnetic coupling between the first magnetic pattern 140 and the second magnetic pattern 142. Accordingly, it is possible to provide a magnetic memory device capable of increasing the stability of magnetization of the reference magnetic structure RMS, and improving the tunneling magnetoresistance ratio of the magnetic tunnel junction pattern MTJ.

Referring back to FIG. 3, the reference magnetic structure RMS may further include a seed pattern 106 between the bottom electrode BE and the first pinned pattern 110. The seed pattern 106 may include a material contributing to a crystal growth of the first pinned pattern 110. In some embodiments, the seed pattern 106 may include a conductive material having the same crystal structure as the first pinned pattern 110. For example, the seed pattern 106 may include ruthenium (Ru).

The tunnel barrier pattern TBR may include at least one of magnesium oxide, titanium oxide, aluminum oxide, magnesium-zinc oxide, magnesium-boron oxide, titanium nitride or vanadium nitride. As an example, the tunnel barrier pattern TBR may include a magnesium oxide layer having a sodium chloride (NaCl) crystal structure.

The free magnetic structure FMS may include a free magnetic pattern 170 and a capping oxide pattern 180. The free magnetic pattern 170 may be provided between the tunnel barrier pattern TBR and the capping oxide pattern 180, and the capping oxide pattern 180 may be provided between the free magnetic pattern 170 and the top electrode TE.

The free magnetic pattern 170 may be in contact with the tunnel barrier pattern TBR. The free magnetic pattern 170 may exhibit a perpendicular magnetization property, which results from magnetic anisotropy induced by a contact between the free magnetic pattern 170 and the tunnel barrier pattern TBR. A magnetization direction 170m of the free magnetic pattern 170 may be changed to be parallel or anti-parallel to the magnetization direction 130m of the second pinned pattern 130. A resistance value of the magnetic tunnel junction pattern MTJ may be dependent on the relative magnetization directions of the second pinned pattern 130 and the free magnetic pattern 170. For example, the magnetic tunnel junction pattern MTJ may have a first resistance value when the magnetization direction 130m of the second pinned pattern 130 is parallel to the magnetization direction 170m of the free magnetic pattern 170. The magnetic tunnel junction pattern MTJ may have a second resistance value higher than the first resistance value when the magnetization direction 130m of the second pinned pattern 130 is anti-parallel to the magnetization direction 170m of the free magnetic pattern 170.

The free magnetic pattern 170 may include a magnetic material that induces the magnetic anisotropy at an interface between the free magnetic pattern 170 and the tunnel barrier pattern TBR. For example, the free magnetic pattern 170 may include cobalt-iron-boron (CoFeB).

The capping oxide pattern 180 may be in contact with the free magnetic pattern 170. The magnetic anisotropy may be induced at an interface between the capping oxide pattern 180 and the free magnetic pattern 170. As an example, oxygen atoms in the capping oxide pattern 180 may react with iron atoms in the free magnetic pattern 170 and the magnetic anisotropy may be induced by a bond between the oxygen atoms and iron atoms. Accordingly, the magnetic anisotropy of the free magnetic pattern 170 may be improved. The capping oxide pattern 180 may include, for example, magnesium oxide (MgO), tantalum oxide (TaO) and/or aluminum oxide (AlO).

A upper interlayer insulating layer 190 may be provided on the lower interlayer insulating layer 102 to extend on or cover the bottom electrode BE, the magnetic tunnel junction pattern MTJ and the top electrode TE. An upper contact plug 192 may be connected to the top electrode TE through the upper interlayer insulating layer 190.

The upper interlayer insulating layer 190 may include oxide, nitride and/or oxynitride, and the upper contact plug 192 may include at least one of metals (e.g., titanium, tantalum, copper, aluminum or tungsten) or conductive metal nitrides (e.g., titanium nitride or tantalum nitride). An interconnection line 194 may be provided on the upper interlayer insulating layer 190. The interconnection line 194 may be connected to the upper contact plug 192. The interconnection line 194 may include at least one of metals (e.g., titanium, tantalum, copper, aluminum or tungsten) or conductive metal nitrides (e.g., titanium nitride or tantalum nitride). In some embodiments, the interconnection line 194 may serve as a bit line.

Figure 6:
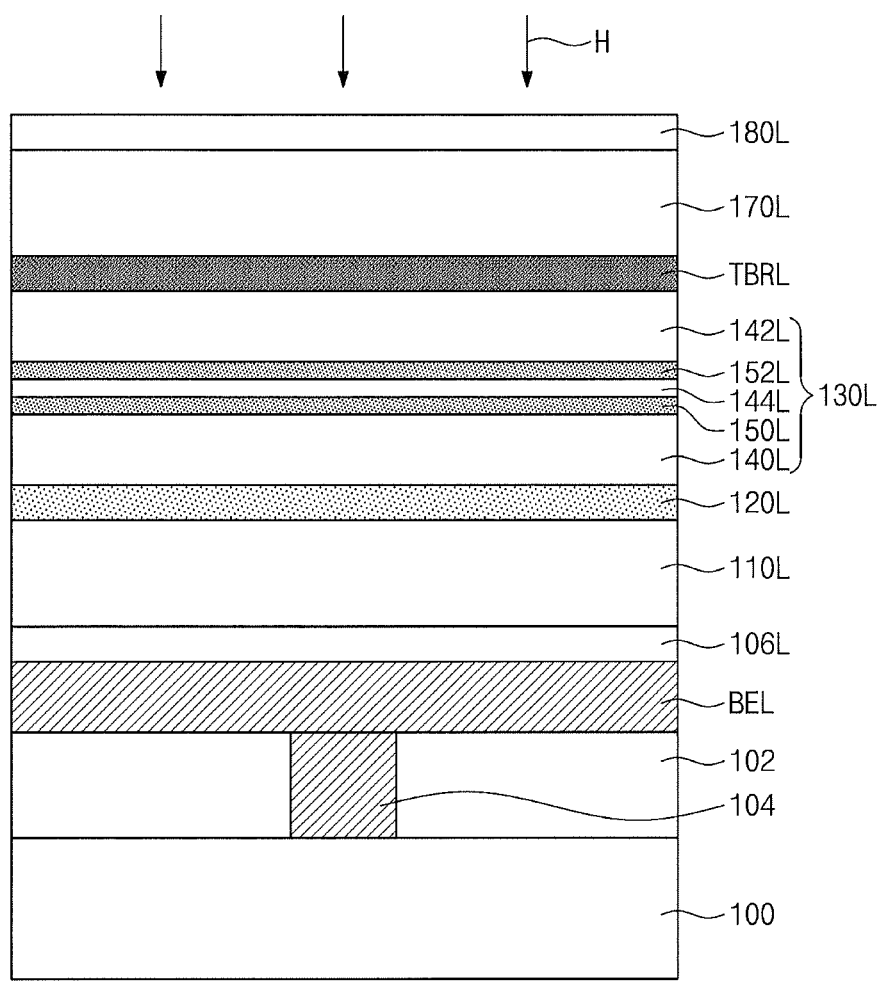
FIGS. 6 and 7 are cross-sectional views illustrating a method for fabricating a magnetic memory device according to some embodiments of the inventive concepts.
Figure 7:
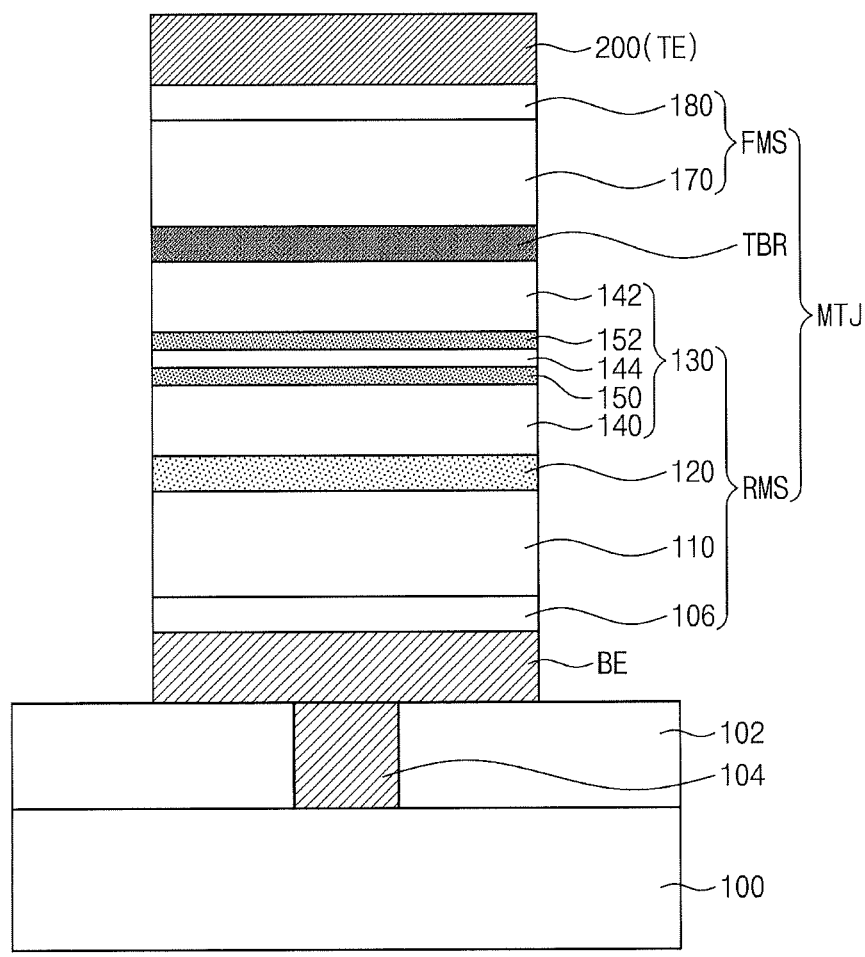

FIGS. 6 and 7 are cross-sectional views illustrating a method for fabricating a magnetic memory device according to some embodiments of the inventive concepts.

Referring to FIG. 6, a lower interlayer insulating layer 102 may be formed on a substrate 100. The substrate 100 may include a semiconductor substrate. For example, the substrate 100 may include a silicon substrate, a germanium substrate, a silicon-germanium substrate and so on. In some embodiments, selection elements may be formed on the substrate 100, and the lower interlayer insulating layer 102 may be formed to extend on or cover the selection elements. The selection elements may be field effect transistors. Alternatively, the selection elements may be diodes. The lower interlayer insulating layer 102 may be formed to have a single- or multi-layered structure including oxide, nitride and/or oxynitride. The lower contact plug 104 may be formed in the lower interlayer insulating layer 102. The lower contact plug 104 may be formed to penetrate the lower interlayer insulating layer 102, and may be electrically connected to a terminal of a corresponding one of the selection elements. The lower contact plug 104 may include at least one of doped semiconductor materials (e.g., doped silicon), metals (e.g., tungsten, titanium and/or tantalum), conductive metal nitrides (e.g., titanium nitride, tantalum nitride and/or tungsten nitride) or metal-semiconductor compounds (e.g., metal silicide).

A bottom electrode layer BEL may be formed on the lower interlayer insulating layer 102. The bottom electrode layer BEL may include conductive metal nitrides, such as titanium nitride and/or tantalum nitride. A seed layer 106L may be formed on the bottom electrode layer BEL. The seed layer 106L may include materials (e.g., ruthenium (Ru)) contributing to crystal growth of magnetic layers formed thereon. The bottom electrode layer BEL and the seed layer 106L may be formed by a sputtering process, a chemical vapor deposition process, an atomic layer deposition process and so on.

A first pinned layer 110L, an exchange coupling layer 120L and a second pinned layer 130L may be stacked on the seed layer 106L. Specifically, the first pinned layer 110L may be formed on the seed layer 106L. The first pinned layer 110L may be formed using the seed layer 106L as a seed. The first pinned layer 110L may have the same crystal structure as the seed layer 106L. For example, the seed layer 106L may include ruthenium (Ru) having a hexagonal close-packed crystal structure, and the first pinned layer 110L may include a cobalt-platinum (CoPt) alloy having a hexagonal close-packed crystal structure or [Co/Pt]n (where n is the number of stacked pairs of layers). The exchange coupling layer 120L may be formed on the first pinned layer 110L. The exchange coupling layer 120L may be formed using the first pinned layer 110L as a seed. For example, the exchange coupling layer 120L may include ruthenium (Ru) having a hexagonal close-packed crystal structure.

The second pinned layer 130L may be formed on the exchange coupling layer 120L. The second pinned layer 130L may include a first magnetic layer 140L, a first non-magnetic layer 150L, a third magnetic layer 144, a second non-magnetic layer 152L and a second magnetic layer 142L which are sequentially stacked on the exchange coupling layer 120L. Specifically, the first magnetic layer 140L may be formed on the exchange coupling layer 120L. The first magnetic layer 140L may be formed using the exchange coupling layer 120L as a seed. The first magnetic layer 140L may be formed to have a hexagonal close-packed (HCP) crystal structure or a face centered cubic (FCC) crystal structure, and a (0001) plane of the HCP crystal structure or a (111) plane of the FCC crystal structure may be parallel to a top surface of the substrate 100. For example, the first magnetic layer 140L may include at least one of cobalt (Co) or nickel (Ni). The first non-magnetic layer 150L may be formed on the first magnetic layer 140L. The first non-magnetic layer 150L may be formed using the first magnetic layer 140L as a seed. The first non-magnetic layer 150L may be formed to have a hexagonal close-packed (HCP) crystal structure or a face centered cubic (FCC) crystal structure, and a (0001) plane of the HCP crystal structure or a (111) plane of the FCC crystal structure may be parallel to the top surface of the substrate 100. For example, the first non-magnetic layer 150L may include at least one of Ir, Rh, Pd, Ag, Ru, Y, Sc, Zr, Hf, Ti or Re. The third magnetic layer 144L may be formed on the first non-magnetic layer 150L. The third magnetic layer 144L may be formed in an amorphous state during a deposition process. The third magnetic layer 144L may include, for example, boron-doped iron (e.g., iron-boron (FeB)). The second non-magnetic layer 152L may be formed on the third magnetic layer 144L. The second non-magnetic layer 152L may be formed to have a body centered cubic (BCC) crystal structure, and a (001) plane of the BCC crystal structure may be parallel to the top surface of the substrate 100. For example, the second non-magnetic layer 152L may include at least one of W, Mo, Nb, Ta or V. The second magnetic layer 142L may be formed on the second non-magnetic layer 152L. The second magnetic layer 142L may be formed in an amorphous state during a deposition process. The second magnetic layer 142L may include a different material from that of the third magnetic layer 144L. For example, the second magnetic layer 142L may include cobalt-iron-boron (CoFeB). The second magnetic layer 142L may be formed using a sputtering process, a chemical vapor deposition process or an atomic layer deposition process.

A tunnel barrier layer TBRL may be formed on the second pinned layer 130. The tunnel barrier layer TBRL may include at least one of magnesium (Mg) oxide, titanium (Ti) oxide, aluminum (Al) oxide, magnesium-zinc (Mg—Zn) oxide, or magnesium-boron (Mg—B) oxide. The tunnel barrier layer TBRL may be formed using, for example, a sputtering process.

A free magnetic layer 170L and a capping oxide layer 180L may be sequentially formed on the tunnel barrier layer TBRL. The free magnetic layer 170L may be formed in an amorphous state during a deposition process. The free magnetic layer 170L may include, for example, cobalt-iron-boron (CoFeB). The free magnetic layer 170L may be formed using a sputtering process, a chemical vapor deposition process or an atomic layer deposition process. The capping oxide layer 180L may include, for example, magnesium oxide (MgO), tantalum oxide (TaO) and/or aluminum oxide (AlO). The capping oxide layer 180L may be formed using a sputtering process.

After the capping oxide layer 180L is formed, a thermal treatment process (H) may be performed. The thermal treatment process H may also be performed after forming the free magnetic layer 170L and before forming the capping oxide layer 180L. The second magnetic layer 142L and the free magnetic layer 170L may be crystallized by the thermal treatment process H. The crystallized second magnetic layer 142L may have the same crystal structure as the second non-magnetic layer 152L. The crystallized second magnetic layer 142L may be crystallized using the tunnel barrier layer TBRL as a seed during the thermal heat treatment process H. For example, the tunnel barrier layer TBRL may have a sodium chloride-type crystal structure, and the crystallized second magnetic layer 142L may have a body centered cubic (BCC) crystal structure. The crystallized free magnetic layer 170L may have the same crystal structure as the crystallized second magnetic layer 142L. The crystallized free magnetic layer 170L may be crystallized using the tunnel barrier layer TBRL as a seed during the thermal treatment process H. For example, the tunnel barrier layer TBRL may have a sodium chloride-type crystal structure, and the crystallized free magnetic layer 170L may have a body centered cubic (BCC) crystal structure.

At least a portion of the third magnetic layer 144L may be in an amorphous state even after the thermal treatment process H. As the third magnetic layer 144L may be interposed between the first and second non-magnetic layers 150L and 152L, boron (B) in the third magnetic layer 144L may be prevented (or suppressed) from being diffused out of the third magnetic layer 144L during the thermal treatment process H. Accordingly, at least a portion of the third magnetic layer 144L may remain in an amorphous state even after the thermal treatment process H.

Referring to FIG. 7, a conductive mask pattern 200 may be formed on the capping oxide layer 180L. The conductive mask pattern 200 may include at least one of tungsten, titanium, tantalum, aluminum or metal nitrides (e.g., titanium nitride or tantalum nitride). The conductive mask pattern 200 may be used to define a position and a shape for forming a magnetic tunnel junction pattern to be described later. The capping oxide layer 180L, the free magnetic layer 170L, the tunnel barrier layer TBRL, the second pinned layer 130L, the exchange coupling layer 120L, the first pinned layer 110L, the seed layer 106L and the bottom electrode layer BEL may be sequentially etched using the conductive mask pattern 200 as an etch mask. The etching process may be performed using, for example, an ion beam etching process. As a result of the etching process, a bottom electrode BE, a seed pattern 106, a first pinned pattern 110, an exchange coupling pattern 120, a second pinned pattern 130, a tunnel barrier pattern TBR, a free magnetic pattern 170 and a capping oxide pattern 180 may be sequentially formed on the lower interlayer insulating layer 102. The second pinned pattern 130 may include a first magnetic pattern 140 adjacent the exchange coupling pattern 120, a second magnetic pattern 142 adjacent the tunnel barrier pattern TBR, a third magnetic pattern 144 between the first magnetic pattern 140 and a second magnetic pattern 142, a first non-magnetic pattern 150 between the first magnetic pattern 140 and the third magnetic pattern 144, and a second non-magnetic pattern 152 between the second magnetic pattern 142 and the third magnetic pattern 144. The seed pattern 106, the first pinned pattern 110, the exchange coupling pattern 120 and the second pinned pattern 130 may constitute or define a reference magnetic structure RMS. The free magnetic pattern 170 and the capping oxide pattern 180 may constitute or define a free magnetic structure FMS. The reference magnetic structure RMS, the free magnetic structure FMS, and the tunnel barrier pattern TBR therebetween may constitute or define a magnetic tunnel junction pattern MTJ. The bottom electrode BE may be electrically connected to the lower contact plug 104 formed in the lower interlayer insulating layer 102. The conductive mask pattern 200 may serve as a top electrode TE. The magnetic tunnel junction pattern MTJ may be formed between the bottom electrode BE and the top electrode TE.

Referring back to FIG. 3, the upper interlayer insulating layer 190 may be formed on the lower interlayer insulating layer 102 so as to extend on or cover the bottom electrode BE, the magnetic tunnel junction pattern MTJ and the top electrode TE. The upper contact plug 192 may be formed to penetrate the upper interlayer insulating layer 190, and may be connected to the top electrode TE. An interconnection line 194 may be formed on the upper interlayer insulating layer 190. The interconnection line 194 may be connected to the upper contact plug 192. In some embodiments, the interconnection line 194 may serve as a bit line.

Figure 8:
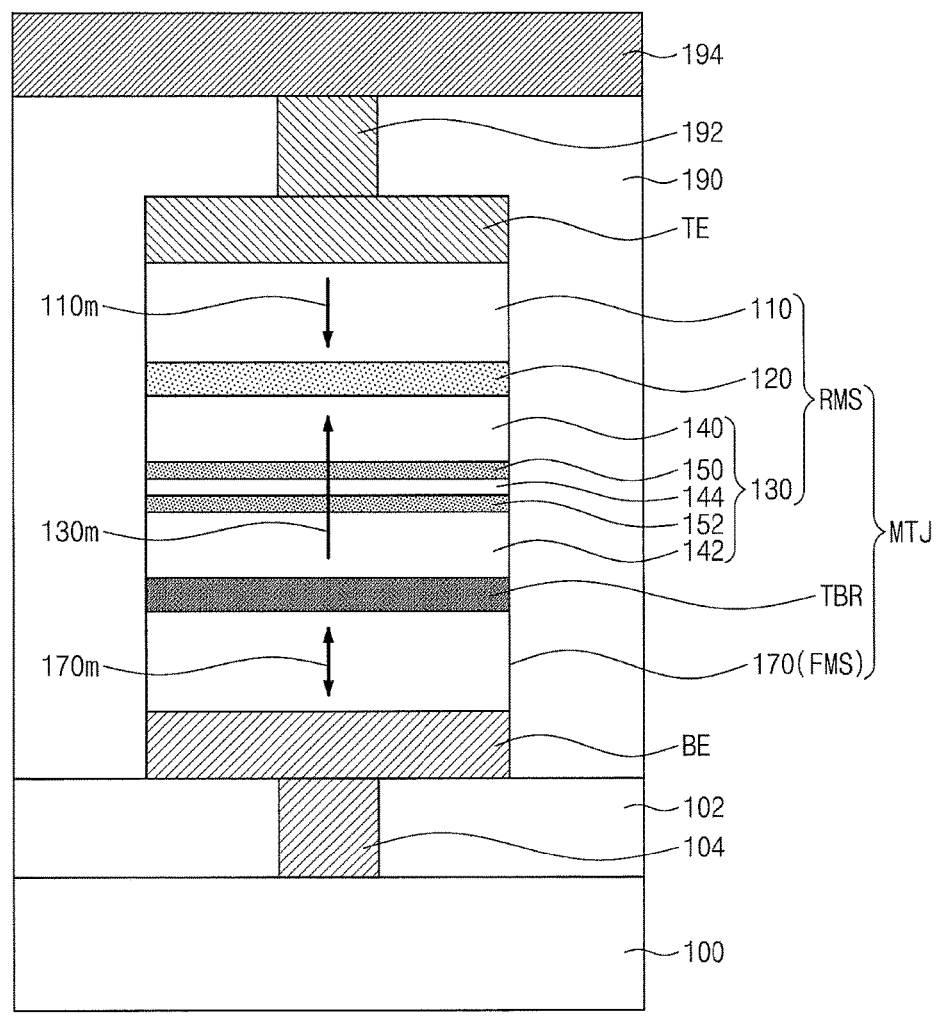
FIG. 8 is a cross-sectional view illustrating a magnetic memory device according to some embodiments of the inventive concepts.

FIG. 8 is a cross-sectional view illustrating a magnetic memory device according to some embodiments of the inventive concepts. In the following description, an element previously described with reference to FIGS. 3, 4, 5A and 5B may be identified by a similar or identical reference number without repeating an overlapping description thereof, for the sake of brevity.

Referring to FIG. 8, a lower interlayer insulating layer 102 may be provided on a substrate 100. Selection elements may be provided on the substrate 100, and the lower interlayer insulating layer 102 may be provided to extend on or cover the selection elements. A lower contact plug 104 may be provided in the lower interlayer insulating layer 102. The lower contact plug 104 may be provided to penetrate the lower interlayer insulating layer 102, and may be electrically connected to a terminal of a corresponding one of selection elements.

A bottom electrode BE may be provided on the lower interlayer insulating layer 102. The bottom electrode BE may be electrically connected to the lower contact plug 104. A reference magnetic structure RMS and a free magnetic structure FMS may be stacked on the lower interlayer insulating layer 102. A tunnel barrier pattern TBR may be provided between the reference magnetic structure RMS and the free magnetic structure FMS. In some embodiments, the free magnetic structure FMS may be provided between the bottom electrode BE and the tunnel barrier pattern TBR.

The reference magnetic structure RMS may include at least one fixed layer having a fixed magnetization direction, and the free magnetic structure FMS may include at least one free layer having a switchable magnetization direction. The reference magnetic structure RMS, the free magnetic structure FMS and the tunnel barrier pattern TBR may constitute or define a magnetic tunnel junction pattern MTJ. The magnetization directions of the fixed layer and the free layer may be substantially perpendicular to an interface between the tunnel barrier pattern TBR and the free magnetic structure FMS. That is, the magnetic tunnel junction pattern MTJ may be a perpendicular magnetization-type magnetic tunnel junction pattern.

A top electrode TE may be provided on the magnetic tunnel junction pattern MTJ. The magnetic tunnel junction pattern MTJ may be disposed between the bottom electrode BE and the top electrode TE. In some embodiments, the reference magnetic structure RMS may be provided between the tunnel barrier pattern TBR and the top electrode TE. The bottom electrode BE, the magnetic tunnel junction pattern MTJ and the top electrode TE may be provided to have a vertical-aligned sidewalls.

The free magnetic structure FMS may include a free magnetic pattern 170 between the bottom electrode BE and the tunnel barrier pattern TBR. In some embodiments, the bottom electrode BE may include a material contributing to crystal growth of the free magnetic pattern 170. The free magnetic pattern 170 may be in contact with the tunnel barrier pattern TBR. The free magnetic pattern 170 may exhibit a perpendicular magnetization property, which results from magnetic anisotropy induced by a contact between the free magnetic pattern 170 and the tunnel barrier pattern TBR. The free magnetic pattern 170 may include a magnetic material that induces magnetic anisotropy at an interface between the free magnetic pattern 170 and the tunnel barrier pattern TBR. For example, the free magnetic pattern 170 may include cobalt-iron-boron (CoFeB).

The reference magnetic structure RMS may include a synthetic antiferromagnetic (SAF) structure. For example, the reference magnetic structure RMS may include a first pinned pattern 110 between the tunnel barrier pattern TBR and the top electrode TE, a second pinned pattern 130 between the first pinned pattern 110 and the tunnel barrier pattern TBR, and an exchange coupling pattern 120 between the first pinned pattern 110 and the second pinned pattern 130. The exchange coupling pattern 120 may couple the first pinned pattern 110 to the second pinned pattern 130 in such a way that a magnetization direction 110m of the first pinned pattern 110 is anti-parallel to a magnetization direction 130m of the second pinned pattern 130. The exchange coupling pattern 120 may include, for example, ruthenium (Ru). The first pinned pattern 110 may include substantially the same material as the first pinned pattern 110 according to some embodiments described with reference to FIG. 3.

The second pinned pattern 130 may include a first magnetic pattern 140 adjacent the exchange coupling pattern 120, a second magnetic pattern 142 adjacent the tunnel barrier pattern TBR, a third magnetic pattern 144 between the first magnetic pattern 140 and the second magnetic pattern 142, a first non-magnetic pattern 150 between the first magnetic pattern 140 and the third magnetic pattern 144, and a second non-magnetic pattern 152 between the second magnetic pattern 142 and the third magnetic pattern 144. The first to third magnetic patterns 140, 142 and 144 and the first and second non-magnetic patterns 150 and 152 may be substantially the same as the first to third magnetic patterns 140, 142 and 144 and the first and second non-magnetic patterns 150 and 152 according to some embodiments described with reference to FIGS. 3, 4, 5A and 5B.

A magnetization direction 170*m* of the free magnetic pattern 170 may be changed to be parallel or anti-parallel to the magnetization direction 130*m* of the second pinned pattern 130. A resistance value of the magnetic tunnel junction pattern MTJ may be dependent on the relative magnetization directions of the second pinned pattern 130 and the free magnetic pattern 170. For example, the magnetic tunnel junction pattern MTJ may have a first resistance value when the magnetization direction 130*m* of the second pinned pattern 130 is parallel to the magnetization direction 170*m* of the free magnetic pattern 170. The magnetic tunnel junction pattern MTJ may have a second resistance value higher than the first resistance value when the magnetization direction 130*m* of the second pinned pattern 130 is anti-parallel to the magnetization direction 170*m* of the free magnetic pattern 170.

The upper interlayer insulating layer 190 may be provided on the lower interlayer insulating layer 102 to extend on or cover the bottom electrode BE, the magnetic tunnel junction pattern MTJ and the top electrode TE. The upper contact plug 192 may be provided to penetrate the upper interlayer insulating layer 190, and may be connected to the top electrode TE. An interconnection line 194 may be provided on the upper interlayer insulating layer 190, and may be connected to the upper contact plug 192. In some embodiments, the interconnection line 194 may serve as a bit line.

Figure 9:
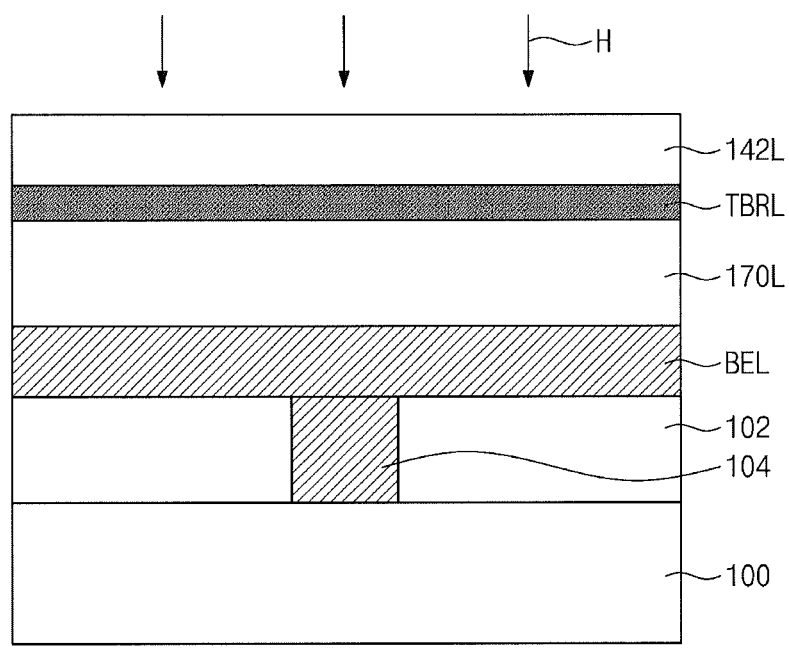
FIGS. 9 to 11 are cross-sectional views illustrating a method for fabricating a magnetic memory device according to some embodiments of the inventive concepts.
Figure 10:
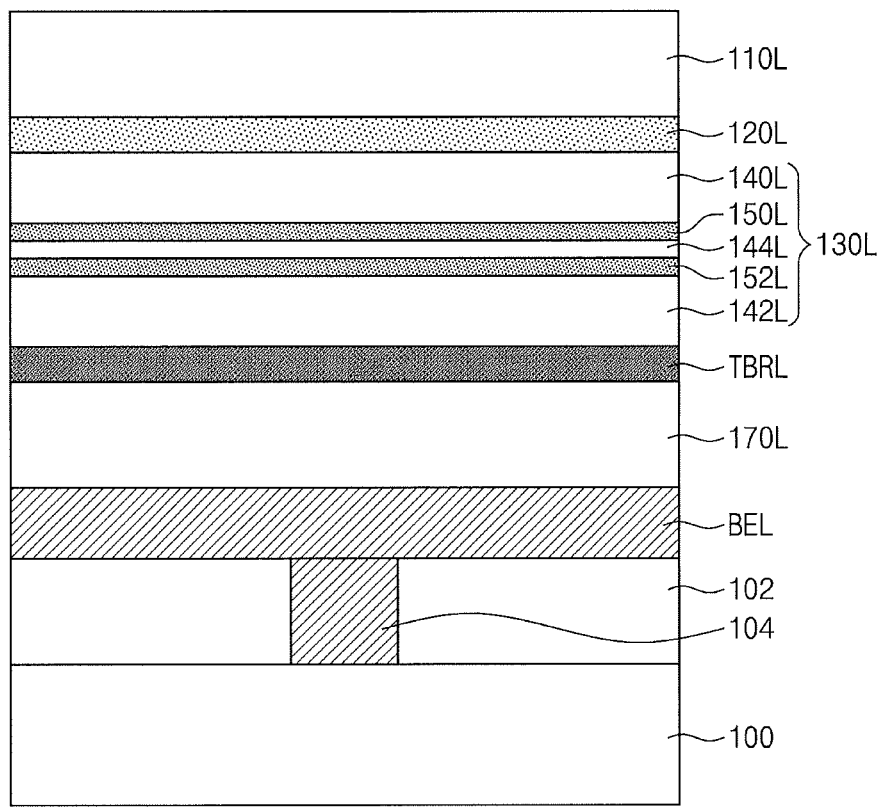
Figure 11:
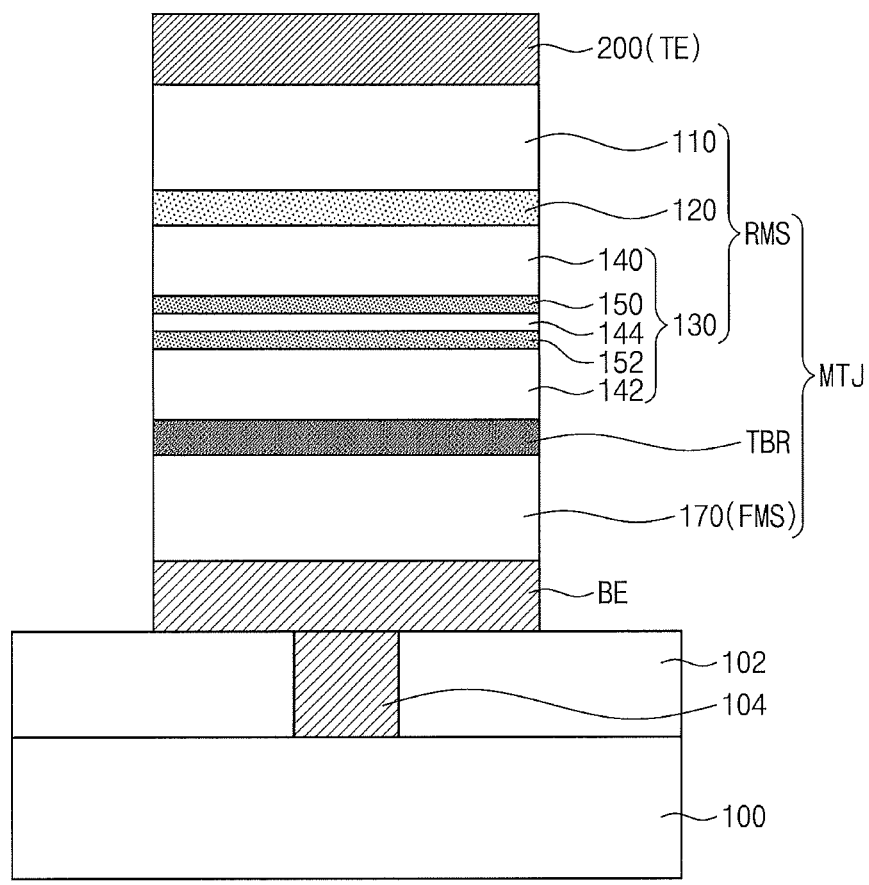

FIGS. 9 to 11 are cross-sectional views illustrating a method for fabricating a magnetic memory device according to some embodiments of the inventive concepts. In the following description, an element previously described with reference to FIGS. 6 and 7 may be identified by a similar or identical reference number without repeating an overlapping description thereof, for the sake of brevity.

Referring to FIG. 9, a lower interlayer insulating layer 102 may be formed on a substrate 100. Selection elements may be formed on the substrate 100, and the lower interlayer insulating layer 102 may be formed to extend on or cover the selection elements. A lower contact plug 104 may be formed in the lower interlayer insulating layer 102. The lower contact plug 104 may be formed to penetrate the lower interlayer insulating layer 102, and may be electrically connected to a terminal of corresponding one of the selection elements.

A bottom electrode layer BEL may be formed on the lower interlayer insulating layer 102. The bottom electrode layer BEL may include conductive metal nitrides, such as titanium nitride and/or tantalum nitride. According to some embodiments, the bottom electrode layer BEL may further include a material contributing to crystal growth of magnetic layers formed thereon. A free magnetic layer 170L may be formed on the bottom electrode layer BEL. The free magnetic layer 170L may be in an amorphous state during a deposition process. The free magnetic layer 170L may include, for example, cobalt-iron-boron (CoFeB). A tunnel barrier layer TBRL may be formed the free magnetic layer 170L. The tunnel barrier layer TBRL may be the same as the tunnel barrier layer TBRL described with reference to FIG. 6.

A second magnetic layer 142L may be formed on the tunnel barrier layer TBRL. The second magnetic layer 142L may be in an amorphous state during a deposition process. The second magnetic layer 142L may include the same material as the second magnetic layer 142L. The second magnetic layer 142L may include, for example, cobalt-iron-boron (CoFeB).

In some embodiments, a thermal treatment process H may be performed after forming the second magnetic layer 142L. The second magnetic layer 142L and the free magnetic layer 170L may be crystallized by the thermal treatment process H. The crystallized free magnetic layer 170L may have the same crystal structure as the crystallized second magnetic layer 142L. The crystallized free magnetic layer 170L and the crystallized second magnetic layer 142L may be crystallized using the tunnel barrier layer TBRL as a seed during the thermal treatment process H. For example, the tunnel barrier layer TBRL may have a sodium chloride-type crystal structure, and the crystallized free magnetic layer 170L and the crystallized second magnetic layer 142L may have a body centered cubic (BCC) crystal structure. In other embodiments, the thermal treatment process H may be performed after forming magnetic and non-magnetic layers to be described later.

Referring to FIG. 10, a second non-magnetic layer 152L may be formed on the second magnetic layer 142L. The second non-magnetic layer 152L may have the same crystal structure as the second magnetic layer 142L. The second non-magnetic layer 152L may be formed to have a body centered cubic (BCC) crystal structure, a (001) plane of the body centered cubic (BCC) crystal structure may be parallel to a top surface of the substrate 100. The second non-magnetic layer 152L may include, for example, at least one of W, Mo, Nb, Ta or V. The third magnetic layer 144L may be formed on the second non-magnetic layer 152L. The third magnetic layer 144L may be formed in an amorphous state during a deposition process. For example, the third magnetic layer 144L may include, for example, boron-doped iron (e.g., iron-boron (FeB)). A first non-magnetic layer 150L may be formed on the third magnetic layer 144L. The first non-magnetic layer 150L may be formed to have a hexagonal close-packed (HCP) crystal structure or a face centered cubic (FCC) crystal structure, and a (0001) plane of the HCP crystal structure or a (111) plane of the FCC crystal structure may be parallel to the top surface of the substrate 100. For example, the first non-magnetic layer 150L may include at least one of Ir, Rh, Pd, Ag, Ru, Y, Sc, Zr, Hf, Ti or Re. A first magnetic layer 140L may be formed on the first non-magnetic layer 150L. The first magnetic layer 140L may be formed using the first non-magnetic layer 150L as a seed. The first magnetic layer 140L may be formed to have a hexagonal close-packed (HCP) crystal structure or a face centered cubic (FCC) crystal structure, and a (0001) plane of the HCP crystal structure or a (111) plane of the FCC crystal structure may be parallel to the top surface of the substrate 100. For example, the first magnetic layer 140L may include at least one of cobalt (Co) or nickel (Ni). The first to third magnetic layers 140L, 142L and 144L, and the first and second non-magnetic layers 150L and 152L may constitute or define a second pinned layer 130L.

An exchange coupling layer 120L may be formed on the second pinned layer 130L. The exchange coupling layer 120L may be formed using the first magnetic layer 140L as a seed. For example, the exchange coupling layer 120L may include ruthenium (Ru) having a hexagonal close-packed crystal structure. A first pinned layer 110L may be formed on the exchange coupling layer 120L. The first pinned layer 110L may be formed using the exchange coupling layer 120L as a seed. The first pinned layer 110L may include a cobalt-platinum (CoPt) alloy having a hexagonal close-packed crystal structure or [Co/P]n (where n is the number of stacked pairs of layers).

In some embodiments, the thermal treatment process H, described with reference to FIG. 9, may be performed after forming the first pinned layer 110L. In this case, as described with reference to FIG. 9, the second magnetic layer 142L and the free magnetic layer 170L may be crystallized by the thermal treatment process H. At least a portion of the third magnetic layer 144L may be in an amorphous state even after the thermal treatment process. Since the third magnetic layer 144L may be interposed between the first and second non-magnetic layers 150L and 152L, boron (B) in the third magnetic layer 144L may be prevented (or suppressed) from being diffused out of the third magnetic layer 144L during the thermal treatment process H. Accordingly, at least a portion of the third magnetic layer 144L may remain in an amorphous state even after the thermal treatment process H.

Referring to FIG. 11, a conductive mask pattern 200 may be formed on the first pinned layer 110L. The conductive mask pattern 200 may be used to define a position and a shape for forming a magnetic tunnel junction pattern to be described later. The first pinned layer 110L, the exchange coupling layer 120L, the second pinned layer 130L, the tunnel barrier layer TBRL, the free magnetic layer 170L, and the bottom electrode layer BEL may be sequentially etched using the conductive mask pattern 200 as an etch mask. As a result of the etching process, a bottom electrode BE, a free magnetic pattern 170, a tunnel barrier pattern TBR, a second pinned pattern 130, an exchange coupling pattern 120, and a first pinned pattern 110 may be sequentially formed on the lower interlayer insulating layer 102. The second pinned pattern 130 may include a first magnetic pattern 140 adjacent the exchange coupling pattern 120, a second magnetic pattern 142 adjacent the tunnel barrier pattern TBR, a third magnetic pattern 144 between the first magnetic pattern 140 and a second magnetic pattern 142, a first non-magnetic pattern 150 between the first magnetic pattern 140 and the third magnetic pattern 144, and a second non-magnetic pattern 152 between the second magnetic pattern 142 and the third magnetic pattern 144. The first pinned pattern 110, the exchange coupling pattern 120 and the second pinned pattern 130 may constitute or define a reference magnetic structure RMS. The free magnetic pattern 170 may constitute or define a free magnetic structure FMS. The reference magnetic structure RMS, the free magnetic structure FMS, and the tunnel barrier pattern TBR therebetween may constitute or define a magnetic tunnel junction pattern MTJ. The bottom electrode BE may be electrically connected to the lower contact plug 104 formed in the lower interlayer insulating layer 102. The conductive mask pattern 200 may serve as a top electrode TE. The magnetic tunnel junction pattern MTJ may be formed between the bottom electrode BE and the top electrode TE.

A subsequent process may be performed in substantially the same manner as that of the method described with reference to FIG. 3.

According to embodiments of the inventive concepts, a reference magnetic structure of a magnetic tunnel junction pattern may include a first magnetic pattern, a second magnetic pattern, a third magnetic pattern between the first magnetic pattern and the second magnetic pattern, a first non-magnetic pattern between the first magnetic pattern and the third magnetic pattern, and a second non-magnetic pattern between the second magnetic pattern and the third magnetic pattern. At least a portion of the third magnetic pattern may be in an amorphous state, and the first non-magnetic pattern and the second non-magnetic pattern may have a different crystal structure from each other.

The first non-magnetic pattern may have a hexagonal close-packed (HCP) crystal structure or a face centered cubic (FCC) crystal structure. When viewed in a plan view, an arrangement of atoms in the first non-magnetic pattern may be provided to have the same symmetry as an arrangement of atoms in the first magnetic pattern. In this case, a magnetic moment of atoms in the first non-magnetic pattern may be relatively high at an interface between the first non-magnetic pattern and the first magnetic pattern.

The second non-magnetic pattern may be provided to have the same crystal structure (for example, body centered cubic (BCC) crystal structure) as the second magnetic pattern. When viewed in a plan view, an arrangement of atoms in the second non-magnetic pattern may be provided to have the same symmetry as an arrangement of atoms in the second magnetic pattern. In this case, the magnetic anisotropy of the second magnetic pattern induced by a contact between the second magnetic pattern and the tunnel barrier pattern may be improved. When at least a portion of the third magnetic pattern is amorphous, it is possible to suppress that a crystal structure of lower patterns (e.g., the first non-magnetic pattern and the first magnetic pattern) under the third magnetic pattern affects crystal growth of upper patterns (e.g., the second non-magnetic pattern and the second magnetic pattern) over the third magnetic pattern.

Accordingly, it is possible to provide a magnetic memory device capable of increasing the stability of magnetization of the reference magnetic structure RMS, and improving the tunneling magnetoresistance ratio of the magnetic tunnel junction MTJ.

The terminology used herein is for the purpose of describing particular embodiments only and is not intended to be limiting of example embodiments. It will be understood that when an element is referred to as being "on" or "connected to" or "adjacent" another element (e.g., a layer or substrate), it can be directly on or connected to or adjacent the other element, or intervening elements may also be present. In contrast, when an element is referred to as being "directly on" or "directly connected to" or "immediately adjacent" another element, there are no intervening elements present.

It will also be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will be understood that spatially relative terms, such as "beneath," "below," "lower," "above," "upper" and the like, are intended to encompass different orientations of the device in use or operation in addition to the orientation depicted in the figures. For example, if the device in the figures is turned over, elements described as "below" or "beneath" other elements or features would then be oriented "above" the other elements or features. The device may be otherwise oriented (rotated 90 degrees or at other orientations) and the spatially relative descriptors used herein interpreted accordingly.

The use of the terms "a" and "an" and "the" and similar references herein are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "and/or" includes any and all combinations of one or more of the associated listed items.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A magnetic memory device, comprising:
a reference magnetic structure and a free magnetic structure on a substrate; and
a tunnel barrier pattern between the reference magnetic structure and the free magnetic structure,
wherein the reference magnetic structure comprises:
a first pinned pattern;
a second pinned pattern between the first pinned pattern and the tunnel barrier pattern; and
an exchange coupling pattern between the first pinned pattern and the second pinned pattern,
wherein the second pinned pattern comprises:
a first magnetic pattern adjacent the exchange coupling pattern;
a second magnetic pattern adjacent the tunnel barrier pattern;
a third magnetic pattern between the first magnetic pattern and the second magnetic pattern;
a first non-magnetic pattern between the first magnetic pattern and the third magnetic pattern; and
a second non-magnetic pattern between the second magnetic pattern and the third magnetic pattern, and
wherein the first non-magnetic pattern has a different crystal structure from the second non-magnetic pattern, and at least a portion of the third magnetic pattern is amorphous.

2. The magnetic memory device of claim 1, wherein the first non-magnetic pattern has a hexagonal close-packed (HCP) crystal structure or a face centered cubic (FCC) crystal structure, and
wherein the second non-magnetic pattern has a body centered cubic (BCC) crystal structure.

3. The magnetic memory device of claim 2, wherein a (0001) plane of the first non-magnetic pattern having the hexagonal close-packed (HCP) crystal structure, or a (111) plane of the first non-magnetic pattern having the face centered cubic (FCC) crystal structure is parallel to a top surface of the substrate.

4. The magnetic memory device of claim 2, wherein a (001) plane of the second non-magnetic pattern having the body centered cubic (BCC) crystal structure is parallel to a top surface of the substrate.

5. The magnetic memory device of claim 1, wherein the first magnetic pattern is anti-ferromagnetically coupled to the first pinned pattern through the exchange coupling pattern.

6. The magnetic memory device of claim 5, wherein the first non-magnetic pattern and the first magnetic pattern have a hexagonal close-packed (HCP) crystal structure or a face centered cubic (FCC) crystal structure.

7. The magnetic memory device of claim 5, wherein the second magnetic pattern is ferromagnetically coupled to the first magnetic pattern, and the second non-magnetic pattern has the same crystal structure as the second magnetic pattern.

8. A magnetic memory device, comprising:
a reference magnetic structure and a free magnetic structure on a substrate; and
a tunnel barrier pattern between the reference magnetic structure and the free magnetic structure,
wherein the reference magnetic structure comprises:
a first pinned pattern;
a second pinned pattern between the first pinned pattern and the tunnel barrier pattern; and
an exchange coupling pattern between the first pinned pattern and the second pinned pattern,
wherein the second pinned pattern comprises:
a first magnetic pattern adjacent the exchange coupling pattern;
a second magnetic pattern adjacent the tunnel barrier pattern;
a third magnetic pattern between the first magnetic pattern and the second magnetic pattern;
a first non-magnetic pattern between the first magnetic pattern and the third magnetic pattern; and
a second non-magnetic pattern between the second magnetic pattern and the third magnetic pattern, and
wherein the first non-magnetic pattern includes a different material from the second non-magnetic pattern, and at least a portion of the third magnetic pattern is amorphous.

9. The magnetic memory device of claim 8, wherein the first non-magnetic pattern includes at least one of Ir, Rh, Pd, Ag, Ru, Y, Sc, Zr, Hf, Ti, or Re, and wherein the second non-magnetic pattern includes at least one of W, Mo, Nb, Ta or V.

10. The magnetic memory device of claim 8, wherein the second magnetic pattern is in contact with the tunnel barrier pattern, and the second magnetic pattern includes a magnetic material that induces magnetic anisotropy at interface between the second magnetic pattern and the tunnel barrier pattern, and
wherein the second non-magnetic pattern has the same crystal structure as the second magnetic pattern.

11. The magnetic memory device of claim 8, wherein the first non-magnetic pattern has a hexagonal close-packed (HCP) crystal structure or a face centered cubic (FCC) crystal structure.

12. The magnetic memory device of claim 8, wherein the first non-magnetic pattern has a different crystal structure from the second non-magnetic pattern.

13. The magnetic memory device of claim 8, wherein when viewed in plan view, an arrangement of elements in the first non-magnetic pattern has a different symmetry than an arrangement of elements in the second non-magnetic pattern.

14. The magnetic memory device of claim 13, wherein when viewed in the plan view, the elements in the first non-magnetic pattern are arranged to have a 6-fold symmetry, and the elements in the second non-magnetic pattern are arranged to have a 4-fold symmetry.

15. A magnetic memory device, comprising:
a magnetic tunnel junction (MTJ) pattern comprising a reference magnetic structure, a free magnetic structure, and a tunnel barrier pattern therebetween, the reference magnetic structure comprising first and second pinned patterns and an exchange coupling pattern therebetween, wherein the second pinned pattern comprises a first magnetic pattern, a first non-magnetic pattern, a second non-magnetic pattern, and a second magnetic pattern sequentially stacked between the exchange coupling pattern and the tunnel barrier pattern, wherein the first non-magnetic pattern and the first magnetic pattern comprise a same crystal structure.

16. The magnetic memory device of claim 15, wherein the second non-magnetic pattern comprises a different crystal structure than the first non-magnetic pattern, and wherein the second pinned pattern further comprises a third magnetic pattern that is at least partially amorphous between the first and second non-magnetic patterns.

17. The magnetic memory device of claim 16, wherein the second magnetic pattern comprises the same crystal structure as the second non-magnetic pattern, and is ferromagnetically coupled to the first magnetic pattern.

18. The magnetic memory device of claim 17, wherein, when viewed in plan view, arrangements of atoms in the first non-magnetic pattern and the first magnetic pattern have a 6-fold symmetry, and arrangements of atoms in the second non-magnetic pattern and the second magnetic pattern have a 4-fold symmetry.

19. The magnetic memory device of claim 17, wherein the first non-magnetic pattern comprises a hexagonal close-packed (HCP) crystal structure or a face centered cubic (FCC) crystal structure, and wherein the second non-magnetic pattern comprises a body centered cubic (BCC) crystal structure.

20. The magnetic memory device of claim 19; wherein at an interface between the first non-magnetic pattern and the first magnetic pattern, a magnetic moment of atoms in the first non-magnetic pattern is higher than a magnetic moment of atoms in a non-magnetic pattern comprising a BCC crystal structure at an interface with a magnetic pattern comprising a HCP or FCC crystal structure.

\* \* \* \* \*